United States Patent
Uchida et al.

(10) Patent No.: US 9,085,728 B2
(45) Date of Patent: Jul. 21, 2015

(54) COMPOSITION CONTAINING QUANTUM DOT FLUORESCENT BODY, MOLDED BODY OF QUANTUM DOT FLUORESCENT BODY DISPERSION RESIN, STRUCTURE CONTAINING QUANTUM DOT FLUORESCENT BODY, LIGHT-EMITTING DEVICE, ELECTRONIC APPARATUS, MECHANICAL DEVICE, AND METHOD FOR PRODUCING MOLDED BODY OF QUANTUM DOT FLUORESCENT BODY DISPERSION RESIN

(75) Inventors: Hiroshi Uchida, Tokyo (JP); Takaki Yasuda, Tokyo (JP); Toshio Fujita, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 65 days.

(21) Appl. No.: 13/982,182

(22) PCT Filed: Jan. 16, 2012

(86) PCT No.: PCT/JP2012/050679
§ 371 (c)(1),
(2), (4) Date: Sep. 3, 2013

(87) PCT Pub. No.: WO2012/102107
PCT Pub. Date: Aug. 2, 2012

(65) Prior Publication Data
US 2013/0334557 A1    Dec. 19, 2013

(30) Foreign Application Priority Data
Jan. 28, 2011    (JP) ................................. 2011-016335

(51) Int. Cl.
*H01L 33/00*    (2010.01)
*C09K 11/02*    (2006.01)
(Continued)

(52) U.S. Cl.
CPC ............. *C09K 11/025* (2013.01); *C09K 11/565* (2013.01); *H01L 23/564* (2013.01);
(Continued)

(58) Field of Classification Search
CPC ...... H01L 23/564; H01L 33/44; H01L 33/501; H01L 33/502; H01L 23/057; H01L 33/507; H01L 2933/0041; H01L 2224/48247; H01L 2224/48091; H01L 2924/00014
See application file for complete search history.

(56) References Cited

U.S. PATENT DOCUMENTS 6,501,091 B1    12/2002    Bawendi et al.
7,132,787 B2    11/2006    Ozkan et al.
(Continued)

FOREIGN PATENT DOCUMENTS

CN    103270136 A    8/2013
JP    2002-510866 A    4/2002
(Continued)

OTHER PUBLICATIONS

Yu et al. ("Preparation and Characterization of a Novel Flexible Substrate for OLED", Optics Communications, 248, pp. 51-57, 2005).*
(Continued)

*Primary Examiner* — Yasser A Abdelaziez
(74) *Attorney, Agent, or Firm* — Sughrue Mion, PLLC

(57) ABSTRACT

Provided are a composition containing a quantum dot fluorescent body, a molded body of a quantum dot fluorescent body dispersion resin, a structure containing a quantum dot fluorescent body, a light-emitting device, an electronic apparatus or a mechanical device, and a method for producing the molded body. The quantum dot fluorescent body is dispersed in a cycloolefin (co)polymer, which is a dispersion resin, to form the composition containing a quantum dot fluorescent body. The composition containing the quantum dot fluorescent body is molded, forming the molded body of the quantum dot fluorescent body dispersion resin. A gas barrier layer is formed at a portion or the entirety of the surface of the molded body of the quantum dot fluorescent body dispersion resin. A light-emitting device is configured using the composition containing the quantum dot fluorescent body as a sealing material that seals an LED chip.

15 Claims, 7 Drawing Sheets

(51) Int. Cl.
*H01L 23/00* (2006.01)
*H01L 33/44* (2010.01)
*H01L 33/50* (2010.01)
*C09K 11/56* (2006.01)
*H01L 23/057* (2006.01)

(52) U.S. Cl.
CPC ............. *H01L 33/44* (2013.01); *H01L 33/501* (2013.01); *H01L 33/502* (2013.01); *H01L 23/057* (2013.01); *H01L 33/507* (2013.01); *H01L 2224/48091* (2013.01); *H01L 2224/48247* (2013.01); *H01L 2933/0041* (2013.01)

(56) References Cited

U.S. PATENT DOCUMENTS

| | | | |
|---|---|---|---|
| 2002/0055579 A1* | 5/2002 | Oshita et al. | 524/445 |
| 2005/0035365 A1* | 2/2005 | Sato et al. | 257/100 |
| 2006/0081862 A1 | 4/2006 | Chua et al. | |
| 2006/0157686 A1 | 7/2006 | Jang et al. | |
| 2007/0145255 A1* | 6/2007 | Nishikawa et al. | 250/239 |
| 2008/0029710 A1 | 2/2008 | Sekiya et al. | |
| 2009/0014687 A1 | 1/2009 | Kaskel et al. | |
| 2010/0119697 A1 | 5/2010 | Baran | |

FOREIGN PATENT DOCUMENTS

| | | |
|---|---|---|
| JP | 2006-114909 A | 4/2006 |
| JP | 2006-199963 A | 8/2006 |
| JP | 2007-523221 A | 8/2007 |
| JP | 2007-281484 A | 10/2007 |
| JP | 2008-041361 A | 2/2008 |
| JP | 2009-108126 A | 5/2009 |
| JP | 2009-536679 A | 10/2009 |
| WO | 2012/085780 A1 | 6/2012 |

OTHER PUBLICATIONS

STIC Search Report.*
STIC Search Report, Nov. 6th, 2014.*
Office Action, dated Mar. 4, 2014, issued by the State Intellectual Property Office of the People's Republic of China, in counterpart Application No. 201280006414.4.
International Search Report of PCT/JP2012/050679 dated Apr. 17, 2012.
Second Office Action dated Sep. 9, 2014 from the State Intellectual Property Office of the People's Republic of China in counterpart Chinese Patent Application No. 201280006414.4.
First Office Action dated Oct. 17, 2014 from the Korean Intellectual Property Office in counterpart Korean Patent Application No. 10-2013-7018027.

* cited by examiner

COMPOSITION CONTAINING QUANTUM DOT FLUORESCENT BODY, MOLDED BODY OF QUANTUM DOT FLUORESCENT BODY DISPERSION RESIN, STRUCTURE CONTAINING QUANTUM DOT FLUORESCENT BODY, LIGHT-EMITTING DEVICE, ELECTRONIC APPARATUS, MECHANICAL DEVICE, AND METHOD FOR PRODUCING MOLDED BODY OF QUANTUM DOT FLUORESCENT BODY DISPERSION RESIN

CROSS REFERENCE TO RELATED APPLICATIONS

This is a National Stage of International Application No. PCT/JP2012/050679 filed Jan. 16, 2012, claiming priority based on Japanese Patent Application No. 2011-016335 filed Jan. 28, 2011, the contents of all of which are incorporated herein by reference in their entirety.

TECHNICAL FIELD

The present invention relates to improvement of a composition containing a quantum dot fluorescent body, a molded body of a quantum dot fluorescent body dispersion resin, a structure containing a quantum dot fluorescent body, a light-emitting device, an electronic apparatus, a mechanical device, and a method for producing the molded body of a quantum dot fluorescent body dispersion resin.

BACKGROUND ART

In recent years, a quantum dot is used as a fluorescent body which changes the wavelength of the light incoming thereto and emits the light, in a light-emitting diode (LED) or the like. The quantum dot (QD) is a light-emitting semiconductor nanoparticle and it generally has a diameter in the range of 1 to 20 nm. Electrons are quantally trapped in a semiconductor crystal which has a clear edge and is a three-dimensional and nano-level size. When the quantum dot fluorescent body is used, it is generally dispersed in a resin or the like.

For example, Patent Document 1 described below discloses a flash•module in which plural quantum dots are dispersed in a matrix material consisting of PMMA (polymethyl methacrylate), polystyrene, polycarbonate, sol•gel, a UV curable resin, and a thermoset resin such as an epoxy resin.

Further, Patent Document 2 described below discloses a white light-emitting diode with a multilayer structure having a red light-emitting quantum dot layer which is obtained by dispersing the red light-emitting quantum dots in an organic binder such as cellulose polymer including methyl cellulose, ethyl cellulose, and nitrocellulose, an acrylate polymer including polymethyl methacrylate, an epoxy polymer, a polyvinyl alcohol polymer including polyvinyl butyral, and PDMS (polydimethyl siloxane).

In addition, Patent Document 3 described below discloses a composition containing fluorescent inorganic nanoparticles, in which the fluorescent inorganic nanoparticles (that is, quantum dot) are dispersed in a polymer material such as polysiloxane, a fluoro elastomer, polyamide, polyimide, caprolactone, caprolactam, polyurethane, polyvinyl alcohol, polyvinyl chloride, polyvinyl acetate, polyester, polycarbonate, polyacrylate, polymethacrylate, polyacrylamide, and polymethacrylamide.

CITATION LIST

Patent Literature

Patent Document 1: JP 2006-114909 A
Patent Document 2: JP 2007-281484 A
Patent Document 3: JP 2009-536679 A

SUMMARY

However, because the quantum dot fluorescent body has an unstable active surface, it has high reactivity, and therefore aggregation may easily occur. To overcome the problem, the surface of the quantum dot fluorescent body is coated with a capping agent for passivation. Specifically, the surface of the quantum dot fluorescent body core particle is coated with an organic passivating layer. As for the capping agent, a Lewis base compound capable of forming a covalent bond with a metal atom on the surface of the core particle is used.

However, because the quantum dot fluorescent body is also easily deteriorated by oxygen or the like contained in air, as described in each Patent Document above, there has been a need for dispersing particles of the quantum dot fluorescent body in a resin for protection.

However, a new problem occurs in that some resin may accelerate the quenching of the particles of the quantum dot fluorescent body. This is due to the reason that the resin degrades the performance of an organic passivating layer, which is supported on the surface of the quantum dot fluorescent body for the purpose of preventing aggregation or the like.

An object of the invention is to provide a composition which contains a quantum dot fluorescent body and which can suppress quenching of the quantum dot fluorescent body, a molded body of a quantum dot fluorescent body dispersion resin, a structure containing a quantum dot fluorescent body, a light-emitting device, an electronic apparatus, or a mechanical device, and a method for producing the molded body of a quantum dot fluorescent body dispersion resin.

In order to achieve the purpose described above, the present invention provides the following embodiment.

[1] A composition being characterized by having a quantum dot fluorescent body dispersed in a concentration range of 0.01% by mass to 20% by mass in a cycloolefin (co) polymer.

[2] The composition described in above item 1, characterized in that the cycloolefin (co)polymer is represented by Formula (1) or (2):

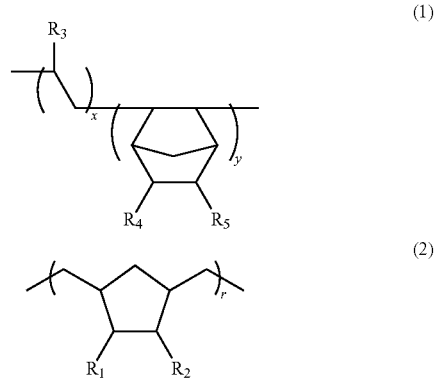

(Here, $R_3$ in Formula (1) represents a monovalent group selected from the group consisting of a hydrogen atom, a linear or branched saturated hydrocarbon group (an alkyl group) having 1 to 6 carbon atoms, a halogen atom such as chlorine and fluorine, and a trihalomethyl group in which the halogen atom is either a chlorine atom or a fluorine atom. $R_4$ and $R_5$ in Formula (1) each independently represents a monovalent group selected from the group consisting of a hydrogen atom, a linear or branched saturated hydrocarbon group having 1 to 6 carbon atoms, a halogen atom such as chlorine and fluorine, and a trihalomethyl group in which the halogen atom is either a chlorine atom or a fluorine atom. In addition, the hydrocarbon group as $R_4$ and $R_5$ may bind to each other at their neighboring substitution site to form at least one 5 to 7 membered cyclic structure of saturated hydrocarbon. Here, x and y are a real number which is greater than 0 but smaller than 1, and they are selected within the range satisfying x+y=1.

Further, $R_1$ and $R_2$ in Formula (2) each independently represents a monovalent group selected from the group consisting of a hydrogen atom, a linear or branched saturated hydrocarbon group having 1 to 6 carbon atoms, a halogen atom such as chlorine and fluorine, and a trihalomethyl group in which the halogen atom is either a chlorine atom or a fluorine atom. In addition, the hydrocarbon group as $R_1$ and $R_2$ may bind to each other at their neighboring substitution site to form at least one 5 to 7 membered cyclic structure of saturated hydrocarbon. Here, r represents a positive integer.)

[3] A molded body of a quantum dot fluorescent body dispersion resin being characterized in that it is obtained as a molded body of the composition containing a quantum dot fluorescent body described in the item 1 or item 2 above.

[4] The molded body of a quantum dot fluorescent body dispersion resin described in the item 3 above, being characterized in that the molded body is a film, or a film having a projection on at least a portion of thereof, or a lens.

[5] A structure containing a quantum dot fluorescent body, having the molded body of the quantum dot fluorescent body dispersion resin described in the item 3 above, and a gas barrier layer formed to cover a portion or the entirety of the surface of the molded body of the quantum dot fluorescent body dispersion resin to reduce the permeation of oxygen to the molded body of the quantum dot dispersion resin.

[6] In the structure containing a quantum dot fluorescent body described in the item 5 above, the gas barrier layer is configured with a layer of an ethylene and vinyl alcohol copolymerization resin or polyvinylidene chloride layer, or it is configured with a layer in which a silica film or an alumina film is formed on at least one surface of a layer of an ethylene and vinyl alcohol copolymerization resin or polyvinylidene chloride.

[7] A light-emitting device being characterized in that the composition containing a quantum dot fluorescent body described in the item 1 or item 2 above is used in at least part of a sealing material for an LED chip.

[8] The light-emitting device described in the item 7 above, being characterized in that the composition containing a quantum dot fluorescent body is used in at least part of a sealing material for an LED chip and thickness of the sealing material is the same or greater than 0.01 mm but less than 0.4 mm.

[9] The light-emitting device described in the item 7 or item 8 above, being characterized in that the molded body of a quantum dot fluorescent body dispersion resin described in the item 4 above is further disposed on top of the sealing material.

[10] The light-emitting device described in the item 7 or item 8 above, characterized in that a gas barrier layer for reducing the permeation of oxygen to the sealing material is further disposed on top of the sealing material.

[11] An electronic apparatus being characterized by being equipped with the light-emitting device described in any one of the item 7 to item 10 above.

[12] A mechanical device being characterized by being equipped with the electronic apparatus described in the item 11 above.

[13] A method for producing a molded body of a quantum dot fluorescent body dispersion resin comprising: preparing a solution in which a cycloolefin (co)polymer is dissolved in a solvent; preparing a composition containing a quantum dot fluorescent body by dispersing the quantum dot fluorescent body in the solution such that the concentration of the quantum dot fluorescent body in the molded body is in the range of 0.01% by mass to 20% by mass followed by kneading; and heating and drying the composition containing a quantum dot fluorescent body after coating it on a substrate or filling it in a mold.

According to the present invention, an excellent composition which contains a quantum dot fluorescent body and which can suppress quenching of the quantum dot fluorescent body, a molded body of a quantum dot fluorescent body dispersion resin, a light-emitting device, an electronic apparatus, or a mechanical device, and a method for producing the molded body of a quantum dot fluorescent body dispersion resin can be provided.

DESCRIPTION OF EMBODIMENT

Figure 1:
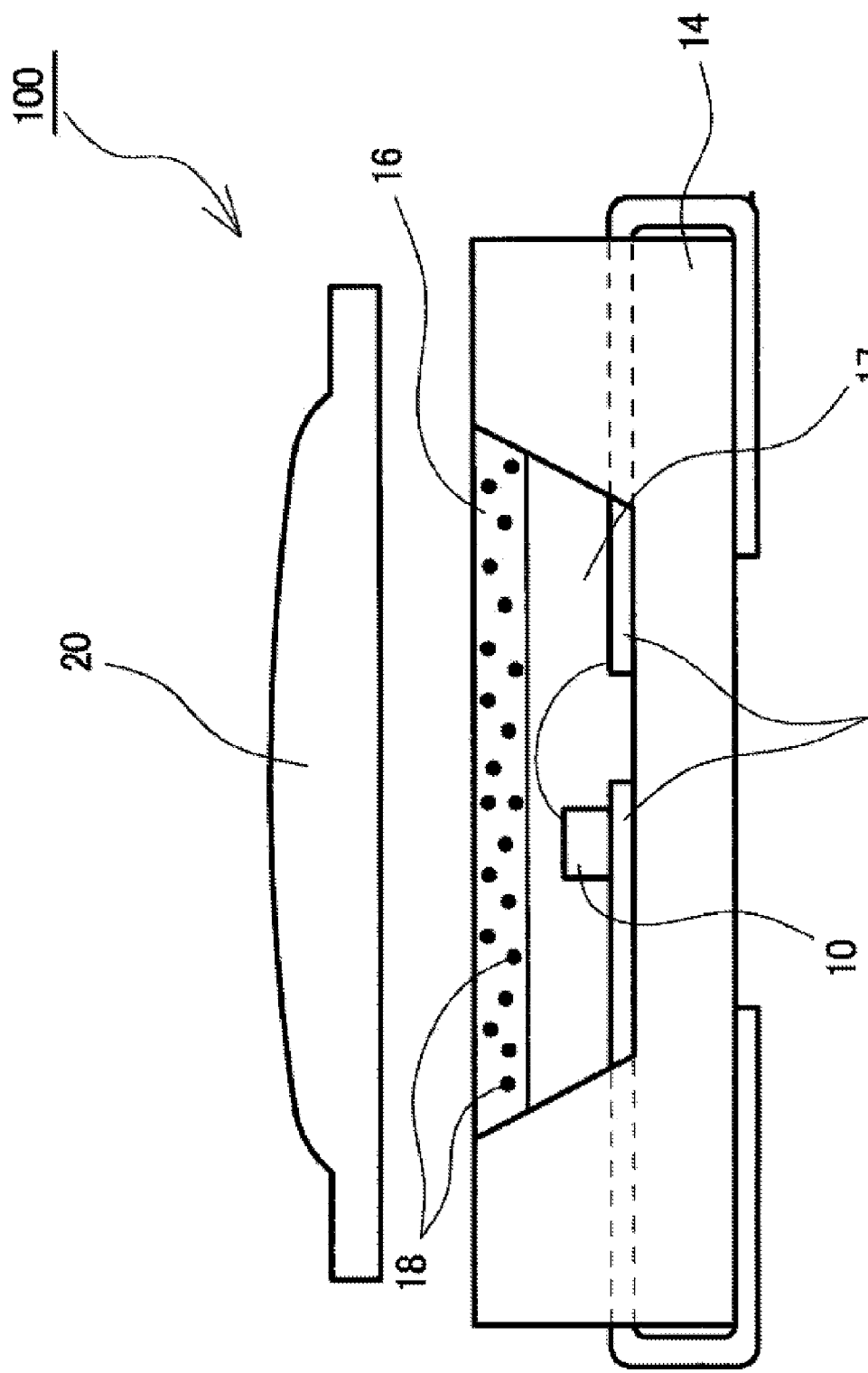
FIG. 1 is a cross-sectional view of an exemplary light-emitting device in which the composition containing a quantum dot fluorescent body according to the first aspect of Embodiment is used in at least part of the sealing material.

Hereinafter, exemplary embodiment of the invention will be described (hereinafter, referred to as an embodiment).

First Aspect of Embodiment

The composition containing a quantum dot fluorescent body according to the first aspect of Embodiment has a configuration that a quantum dot fluorescent body is dispersed in a resin for dispersion. As for the resin for dispersion, a cycloolefin (co)polymer can be used.

In general, an organic passivating layer is coordinated on the surface of a quantum dot fluorescent body particle, i.e, surface of the core, mainly for (A) preventing aggregation. Further, the organic passivating layer (also referred to as a shell) is responsible for, in addition to preventing aggregation, (B) protecting the core particle from surrounding chemical environment, (C) providing electric stability to the surface, and (D) controlling the solubility in a specific solvent system.

In addition, the organic passivator may have a chemical structure that is selected depending on the purpose, and it may be an organic molecule having a linear or a branched aliphatic hydrocarbon with 6 to 18 carbon atoms.

When the quantum dot fluorescent body is dispersed in a resin for dispersion, depending on the resin used, the functions of the organic passivating layer of the quantum dot fluorescent body are impaired, and specifically the functions (B) and (C) may not be achieved in addition to the function of preventing aggregation. For example, there is a possibility that, when an epoxy resin is used as a resin for dispersion, the glycidyl group or acid anhydride contained in the resin may react with an amino group, a carboxyl group, or a mercapto group and all contained in the organic passivator to damage greatly the organic passivating layer on the surface of the quantum dot fluorescent body (for example, the layer is peeled off). In addition, when a silicone resin is used as a resin for dispersion, the Si—H group contained in the silicone resin reacts with the amino group, the carboxyl group, or the mercapto group or the like so that the organic passivating layer may be peeled off from the surface of the quantum dot fluorescent body particle. In addition, when a resin prepared by radical polymerization is used as a resin for dispersion, there is a possibility that the residual radicals bind to the molecular chain of the organic passivating layer present on the surface of the quantum dot fluorescent body particle to damage the core and shell structure, and in an extreme case, the organic passivating layer may be peeled off or the organic passivator is decomposed by them. They are the reasons for aggregation or quenching of the quantum dot fluorescent body particles.

In this connection, in the first aspect of Embodiment, inventors of the present invention found that, by using, as resin for dispersion, a cycloolefin (co)polymer which has no (low) reactivity with the organic passivator and dispersing the quantum dot fluorescent body particles in the concentration range of 0.01% by mass to 20% by mass in the cycloolefin (co)polymer, the functions of the organic passivator can be maintained very well in the quantum dot fluorescent body particles. As described herein, the term "cycloolefin (co)polymer" means a homopolymer or a copolymer which contains a monomer unit having an alicyclic structure in main chain.

The cycloolefin (co)polymer used in the first aspect of Embodiment is obtained by polymerizing cylcloolefins as a monomer, and industrially, norbornenes having high reactivity can be used as cylcoolefins. Further, as for the cycloolefin (co)polymer, dicyclopentadiene (DCP) present in rich amount in C5 distillate fraction of petroleum cracking oil is also used in recent days (reference document; "Non-crystalline cycloolefin polymer" written by Ohara, Designing Next Generation Polymer (edited by Endo Takeshi, Masuda Toshio, and Nishikubo Tadatomi), p 221, published by IPC).

Preferred examples of the resin used in the first aspect of Embodiment include those represented by the following structural Formula (1) or (2).

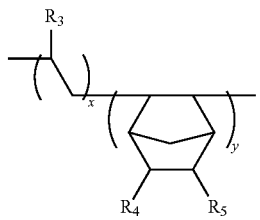

(1)

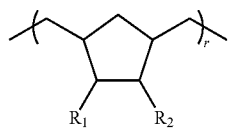

(2)

Herein, $R_3$ in structural Formula (1) represents a monovalent group selected from a group consisting of a hydrogen atom, a linear or branched saturated hydrocarbon group (an alkyl group) having 1 to 6 carbon atoms, a halogen atom being a chlorine atom or a fluorine atom, and a trihalomethyl group in which the halogen atom is either a chlorine atom or a fluorine atom. Examples of the $R_3$ group include a methyl group, an ethyl group, an n-propyl group, an isopropyl group, an n-butyl group, a 2-methyl propyl group, and n-heptyl group, and an n-hexyl group. Of those, $R_3$ is preferably a methyl group or a 2-methyl propyl group.

$R_4$ and $R_5$ in structural Formula (1) each independently represents a monovalent group selected from a group consisting of a hydrogen atom, a linear or branched saturated hydrocarbon group having 1 to 6 carbon atoms, a halogen atom being a chlorine atom or a fluorine atom, and a trihalomethyl group in which the halogen atom is either a chlorine atom or a fluorine atom. In addition, the hydrocarbon group as $R_4$ and $R_5$ may bind to each other at their neighboring substitution site to form at least one 5 to 7 membered cyclic structure of saturated hydrocarbon. Examples thereof include those with at least one cyclic structure such as cycloalkane and norbornane. Herein, x and y are real numbers which are greater than 0 but smaller than 1, and they are selected within the range satisfying $x+y=1$.

The cycloolefin copolymer represented by the structural Formula (1) (hereinafter, referred to as COC type) is obtained by copolymerization of norbornenes as a raw material, for example, with ethylene or the like using a metallocene catalyst. As for the COC type polymer, APL5014DP (chemical structure; $—(C_2H_4)_x(C_{12}H_{16})_y—$; subscripts x and y are real number which are greater than 0 but smaller than 1, and represent copolymerization ratio) manufactured by Mitsui Chemicals, Inc. can be used.

In addition, $R_1$ and $R_2$ in the structural Formula (2) each independently represents a monovalent group selected from the group consisting of a hydrogen atom, a linear or branched saturated hydrocarbon group having 1 to 6 carbon atoms, a halogen atom being a chlorine atom or a fluorine atom, and a trihalomethyl group in which the halogen atom is either a chlorine atom or a fluorine atom. In addition, the hydrocarbon group as $R_1$ and $R_2$ may bind to each other at their neighboring substitution site to form at least one 5 to 7 membered cyclic structure of saturated hydrocarbon. Examples thereof include those with at least one cyclic structure such as cycloalkane and norbornane. Herein, r represents a positive integer.

Further, the cycloolefin (co)polymer represented by the structural Formula (2) (hereinafter, referred to as COP type) is obtained by a ring-opening metathesis polymerization using norbornenes as a raw material, for example, and Grubbs catalyst or the like followed by hydrogenation. Further, r in the formula represents the repeat number of the cycloolefin monomer units. Examples of the COP type polymer which may be used include ZEONEX480R manufactured by Zeon Corporation, Japan.

The non-crystalline cycloolefin polymer is produced as a homopolymer having one type of structural unit selected from various cycloolefin monomer units or a copolymer (resin) having at least two types of cycloolefin monomer units. Examples of the representative structural formula of the COP type polymer include the structural unit A to the structural unit E to be described below. It is also possible to use them in combination to obtain a copolymer containing, for example, 40% by mass of the structural unit C and 60% by mass of the structural unit E.

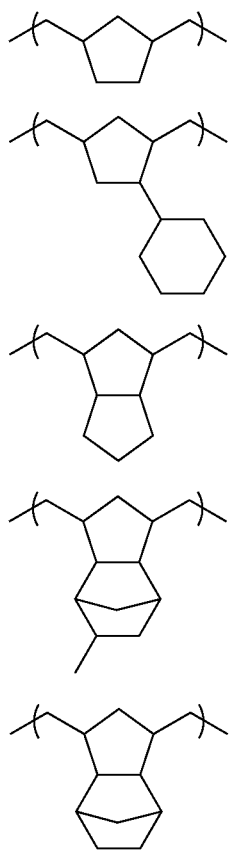

The resin (cycloolefin (co)polymer) explained above does not contain in the molecule a functional group or residual radicals which react with the organic passivator, and thus damage or peeling of the organic passivating layer on surface of the quantum dot fluorescent body particles or decomposition of the organic passivator does not occur. In addition, as the dispersion property of the quantum dot fluorescent body is high in the resin, the quantum dot fluorescent body can be homogeneously dispersed.

A method for dispersing the quantum dot fluorescent body in the resin is not particularly limited. However, it is preferable that, under inert gas atmosphere, a dispersion liquid in which the quantum dot fluorescent body is dispersed in dispersion medium is added and mixed with a solution in which the resin is dissolved in a solvent under inert gas atmosphere. The dispersion medium used therefor is preferably a solvent which can dissolve the resin. More preferably, the dispersion medium is the same as the solvent. Specifically, toluene is preferred. In addition, examples of the inert gas used for the above step include helium gas, argon gas, and nitrogen gas, and they may be used either singly, or as a mixture at any mixing ratio.

Further, the quantum dot fluorescent body used for the first aspect of Embodiment is a fluorescent body having a particle diameter of 1 nm to 100 nm and exhibiting a quantum effect when the diameter is several tens of nm or smaller. The particle diameter of the quantum dot fluorescent body is more preferably in the range of 2 to 20 nm.

A structure of the quantum dot fluorescent body consists of an inorganic fluorescent body core and a capping layer (that is, an organic passivating layer having a hydrocarbon group) coordinated to the surface of the inorganic fluorescent body, and the inorganic fluorescent body core part (that is, metal part) is coated with the organic passivating layer.

(Inorganic Fluorescent Body)

Examples of the inorganic fluorescent body include nanocrystals of Group II-Group VI compound semiconductor and nanocrystals of Group III-Group V compound semiconductor. Configuration of the nanocrystals is not particularly limited, and examples thereof include crystals with core-shell structure in which the shell part comprised of ZnS/ZnO or the like is coated on the core part comprised of InP nanocrystals, crystals which has no clear boundary between core and shell and in which composition varies in gradient, mixed crystals in which two or more types of compound crystals are separately present in the same crystal, and an alloy of two or more types of nanocrystal compounds.

Specific examples of the compound semiconductor include, as a semiconductor of Group II-Group VI compound in a binary system, CdS, CdSe, CdTe, ZnS, ZnSe, ZnTe, HgS, HgSe, HgTe, or the like. Further, specific examples of the semiconductor of Group III-Group V compound include GaN, GaP, GaAs, AlN, AlP, AlAs, InN, InP, InAs, or the like.

A more specific example of the compound semiconductor is a compound semiconductor consisting of an element selected from Group 2 of the Periodic Table (that is, first element) and an element selected from Group 16 of the Periodic Table (that is, second element), for example, MgS, MgSe, MgTe, CaS, CaSe, CaTe, SrS, SrSe, SrTe, BaS, BaSe, and BaTe. Further, it may be a ternary or quaternary compound semiconductor consisting of the elements described above, and it may contain a doping element.

Further, a more specific example of the compound semiconductor is a compound semiconductor consisting of an element selected from Group 12 of the Periodic Table (that is, first element) and an element selected from Group 16 of the Periodic Table (that is, second element), for example, ZnS, ZnSe, ZnTe, CdS, CdSe, CdTe, HgS, HgSe, and HgTe. Further, it may be a ternary or quaternary compound semiconductor consisting of the elements described above, and it may contain a doping element.

Further, a more specific example of the compound semiconductor is a compound semiconductor consisting of an element selected from Group 12 of the Periodic Table (that is, first element) and an element selected from Group 15 of the Periodic Table (that is, second element), for example, $Zn_3P_2$, $Zn_3As_2$, $Cd_3P_2$, $Cd_3As_2$, $Cd_3N_2$, and $Zn_3N_2$. Further, it may be a ternary or quaternary compound semiconductor consisting of the elements described above, and it may contain a doping element.

Further, a more specific examples of the compound semiconductor is a compound semiconductor consisting of an element selected from Group 13 of the Periodic Table (that is, first element) and an element selected from Group 15 of the Periodic Table (that is, second element), for example, BP, AlP, AlAs, AlSb, GaN, GaP, GaAs, GaSb, InN, InP, InAs, InSb, AlN, and BN. Further, it may be a ternary or quaternary compound semiconductor consisting of the elements described above, and it may contain a doping element.

Further, a more specific example of the compound semiconductor is a compound semiconductor consisting of an element selected from Group 13 of the Periodic Table (that is, first element) and an element selected from Group 14 of the Periodic Table (that is, second element), for example, $B_4C_3$, $Al_4C_3$, and $Ga_4C_3$. Further, it may be a ternary or quaternary compound semiconductor consisting of the elements described above, and it may contain a doping element.

Further, a more specific example of the compound semiconductor is a compound semiconductor consisting of an element selected from Group 13 of the Periodic Table (that is, first element) and an element selected from Group 16 of the Periodic Table (that is, second element), for example, $Al_2S_3$, $Al_2Se_3$, $Al_2Te_3$, $Ga_2S_3$, $Ga_2Se_3$, $Ga_2Te_3$, GaTe, $In_2S_3$, $In_2Se_3$, $In_2Te_3$, and InTe. Further, it may be a ternary or quaternary compound semiconductor consisting of the elements described above, and it may contain a doping element.

Further, a more specific example of the compound semiconductor is a compound semiconductor consisting of an element selected from Group 14 of the Periodic Table (that is, first element) and an element selected from Group 16 of the Periodic Table (that is, second element), for example, PbS, PbSe, PbTe, SnS, SnSe, and SnTe. Further, it may be a ternary or quaternary compound semiconductor consisting of the elements described above, and it may contain a doping element.

According to the invention, the nanoparticle material consisting of an element selected from any transition metal group of the Periodic Table (that is, first element) and an element selected from any d-block element group of the Periodic Table (that is, second element) can be used. Examples of the nanoparticle material include NiS, CrS, and $CuInS_2$, but not limited thereto.

Further, the ternary (that is, three-element phase) inorganic fluorescent body is a composition containing three elements that are selected from the Groups described above, and for example, it may be represented as $(Zn_xCd_{x-1}S)_mL_n$ nanocrystals (L is a capping agent). Further, the quaternary (that is, four-element phase) inorganic fluorescent body is a composition containing four elements that are selected from the Groups described above, and for example, it may be represented as $(Zn_xCd_{x-1}S_ySe_{y-1})_mL_n$ nanocrystals (L is a capping agent).

Examples of the ternary or quaternary compound include CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

The method for preparing the inorganic fluorescent body used for the first aspect of Embodiment is not particularly limited, but the examples thereof include a preparing method based on wet chemical method using a metal precursor. Specifically, a method comprising adding a pre-determined metal precursor to an organic solvent in the presence or absence of a dispersing agent, and growing the crystals at constant temperature, can be used for production.

(Capping Agent)

Next, examples of the capping agent (that is, an agent for forming the organic passivating layer) which coordinates to the surface of the inorganic fluorescent body include an organic molecule having an aliphatic hydrocarbon group which has a linear or branched structure with 2 to 30 carbon atoms, preferably 4 to 20 carbon atoms, and more preferably 6 to 18 carbon atoms.

The capping agent (that is, an agent for forming the organic passivating layer) which coordinates to the surface of the inorganic fluorescent body has a functional group for coordination to the inorganic fluorescent body. Examples of the functional group include a carboxyl group, an amino group, an amide group, a nitrile group, a hydroxy group, an ether group, a carbonyl group, a sulfonyl group, a phosphonyl group, and a mercapto group. Of those, the carboxyl group is preferable.

Further, in addition to the functional group for coordination to the inorganic fluorescent body, the capping agent may further contain a functional group in the middle or at the end of the hydrocarbon group. Examples of such functional group include a nitrile group, a carboxyl group, a halogen group, a halogenated alkyl group, an amino group, an aromatic hydrocarbon group, an alkoxy group, and a carbon-carbon double bond.

In the composition containing a quantum dot fluorescent body of the first aspect of Embodiment, the quantum dot fluorescent body is homogeneously dispersed in concentration range of 0.01% by mass to 20% by mass in the cycloolefin (co)polymer. Further, in the composition containing a quantum dot fluorescent body of the first aspect of Embodiment 1, the quantum dot fluorescent body is homogeneously dispersed preferably in the concentration range of more than 0.1% by mass but less than 15% by mass, and more preferably in the concentration range of more than 1% by mass but less than 10% by mass in the cycloolefin (co)polymer.

When the concentration of the quantum dot fluorescent body is less than 0.01% by mass, sufficient light emission intensity is not obtained as the molded body of a quantum dot fluorescent body dispersion resin for a light-emitting element, and that is not preferable. On the other hand, when the concentration of the quantum dot fluorescent body is more than 20% by mass, the quantum dot fluorescent body may aggregate, making it difficult to obtain a molded body of a resin having a quantum dot fluorescent body homogeneously dispersed therein, and this is therefore undesirable.

(Method for Preparing Quantum Dot Fluorescent Body)

To have the quantum dot fluorescent body used in the first aspect of Embodiment, nanocrystals are prepared by using a metal precursor capable of providing nanocrystals of a desired compound semiconductor and by further dispersing them in an organic solvent.

In addition, by treating the nanocrystals with a pre-determined reactive compound, the quantum dot fluorescent body having a structure in which hydrocarbon groups are coordinated to a surface of an inorganic fluorescent body can be prepared.

The treatment method is not particularly limited, and examples include a method of refluxing a dispersion liquid of nanocrystals in the presence of a reactive compound.

In the quantum dot fluorescent body used in the present embodiment, the amount of the hydrocarbon group constituting the organic passivating layer for coating the surface of the inorganic fluorescent body (that is, core part) is not particularly limited. However, the hydrocarbon chain of the hydrocarbon group is 2 mol to 500 mol, preferably 10 mol to 400 mol and still more preferably 20 mol to 300 mol with respect to one particle of the inorganic fluorescent body (that is, core). When the hydrocarbon chain is less than 2 mol, the function as the organic passivating layer cannot be obtained, and thus the fluorescent body particles may easily aggregate, for example. On the other hand, when the hydrocarbon chain is more than 500 mol, not only the light emission intensity from the core part is decreased but also hydrocarbon groups that cannot coordinate to the inorganic fluorescent body are present in an excess amount so that the decrease of the performance of liquid sealing resin tends to occur. In addition, the cost for the quantum dot is increased.

It is also possible that the composition containing a quantum dot fluorescent body according to the first aspect of Embodiment be molded into a molded body to give the molded body of a quantum dot fluorescent body dispersion resin. The molded body plays an effective role of absorbing at least a part of the light emitted from a light source and emitting secondary light from a quantum dot fluorescent body included in the molded body. Examples of the method for molding the composition containing a quantum dot fluorescent body include a method including coating the composition on a substrate or filling it in a mold, removing the solvent by drying with heating under inert gas atmosphere, and releasing it from the substrate or mold, if necessary. Further, the composition containing a quantum dot fluorescent body can be used as a sealing material for sealing an LED chip.

Specifically, the method for producing a molded body of a quantum dot fluorescent body dispersion resin includes preparing a solution in which a cycloolefin (co)polymer is dissolved in a solvent, preparing a composition containing a quantum dot fluorescent body by dispersing the quantum dot fluorescent body in the solution such that the concentration of the quantum dot fluorescent body in the molded body is in the range of 0.01% by mass to 20% by mass followed by kneading, and heating and drying the composition containing a quantum dot fluorescent body after coating it on a substrate or filling it in a mold. According to the embodiment, the solvent and dispersion medium can be used without any limitation. Preferably, a hydrocarbon solvent such as toluene, xylene (o-, m-, or p-), ethyl benzene, and tetralin can be used. In addition, a chlorine-based hydrocarbon solvent like chlorobenzene, dichlorobenzene (o-, m-, or p-), and trichlorobenzene can be used.

By heating and drying as described above or the like, the molded body of a quantum dot fluorescent body dispersion resin can be produced, and after that, a resin lens, a resin plate, or a resin film can be also produced by pressure molding.

Further, the composition of a quantum dot fluorescent body dispersion resin or the molded body described above can be applied to a lighting device for plant cultivation, a color lighting device, a white lighting device, a light source for LED backlight, a liquid crystal filter added with fluorescent body, a resin plate containing fluorescent body, a light source for hair growing device, and a light source used for communication, or the like.

FIG. 1 illustrates a cross-sectional view of an exemplary light-emitting device in which the composition containing a quantum dot fluorescent body according to the first aspect of Embodiment is used in at least a part of the sealing material. The light-emitting device 100 in FIG. 1 comprises the LED chip 10, the lead electrode 12, the cup 14, and the sealing materials 16 and 17. If necessary, the resin lens 20 is disposed on top of the light-emitting device 100.

The cup 14 may be formed of a suitable resin or ceramics. Further, although not specifically limited, a light-emitting diode which constitutes a light source of suitable wavelength in cooperation with the quantum dot fluorescent body, can be used as the LED chip 10. Further, the sealing material 16 can be formed of the composition containing a quantum dot fluorescent body in which the quantum dot fluorescent body 18 is dispersed. Accordingly, by using the light emitted from the LED chip 10, for example, a white light source emitting white light from the sealing material 16 can be formed. Further, the sealing material 17 seals an LED, a lead wire, or the like, and is comprised of a resin like an epoxy resin, a silicone resin, or the like which is generally used as a sealing resin for an LED. Production of the sealing material 16 and the sealing material 17 can be performed by injecting a predetermined amount of an epoxy resin, a silicone resin, or the like into the cup 14 under argon gas atmosphere, solidifying it with a known method to form the sealing material 17, injecting the composition containing a quantum dot fluorescent body on top of the sealing material 17, and drying it by heating to form the sealing material 16.

In addition, it is also possible to have a configuration in which a lens-shaped resin formed of the molded body of a quantum dot fluorescent body dispersion resin (that is, resin lens 20), a film having a projection on at least a portion of it, or a film with even film thickness is disposed on the upper side of the sealing material 16 received by the cup 14 so that light is emitted from the resin lens 20. In such case, it is not necessary to disperse the quantum dot fluorescent body 18 in the sealing material 16. Further, when the composition containing a quantum dot fluorescent body is used for at least a part of the sealing material of an LED chip, thickness of the sealing material 16 is preferably the same or greater than 0.01 mm but less than 0.4 mm. When the thickness of the sealing material 16 is greater than 0.4 mm, although it may depend on the depth of the recess in the cup 14, an excessive load is applied to a wire connected to the lead electrode 12 when the sealing material 16 is injected into the recess of the cup 14, and therefore undesirable. In addition, if the thickness of the sealing material 16 is less than 0.01 mm when the composition containing a quantum dot fluorescent body is used for at least a part of the sealing material of an LED chip, it is not sufficient as a sealing material containing the fluorescent body.

For a case in which the quantum dot fluorescent body 18 is not dispersed in the sealing material 16, it is preferable to dispose the lens-shape resin 20 (that is, resin lens 20) that is formed of the molded body of a quantum dot fluorescent body dispersion resin.

Figure 2:
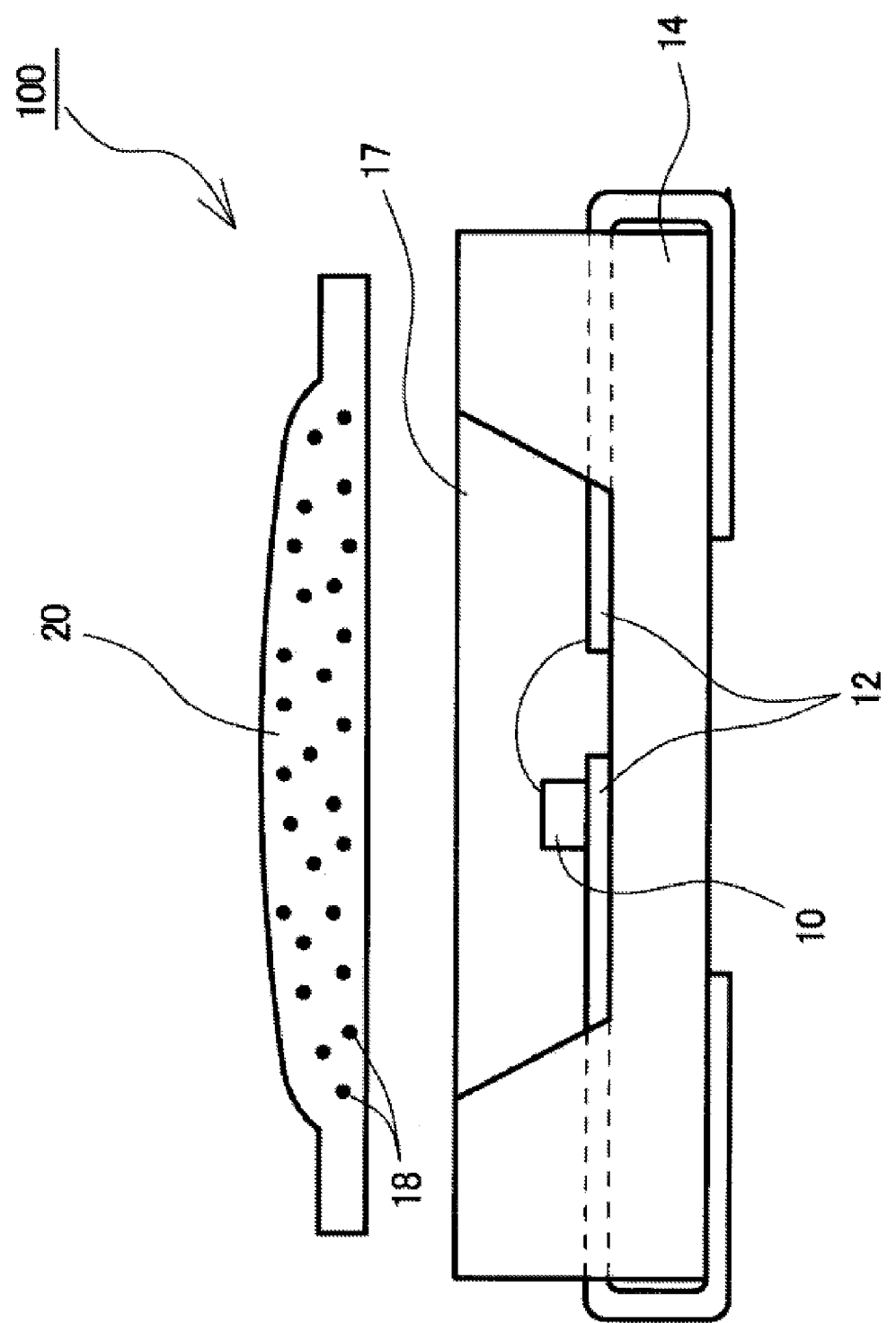
FIG. 2 is a cross-sectional view of an exemplary light-emitting device in which the molded body of a quantum dot fluorescent body dispersion resin according to the first aspect of Embodiment is used.

In FIG. 2, a cross-sectional view of an exemplary light-emitting device using the molded body of a quantum dot fluorescent body dispersion resin according to the first aspect of Embodiment is illustrated, in which the same element as FIG. 1 is given with the same number. FIG. 2 is an example illustrating a light-emitting device in which the composition containing a quantum dot fluorescent body according to the first aspect of Embodiment is not used for the sealing material. In this case, the lens-shaped resin (that is, resin lens 20) is formed of the molded body of a quantum dot fluorescent body dispersion resin that is obtained by molding a composition in which the quantum dot fluorescent body 18 is dispersed in concentration range of 0.01% by mass to 20% by mass in the cycloolefin (co)polymer.

Figure 3:
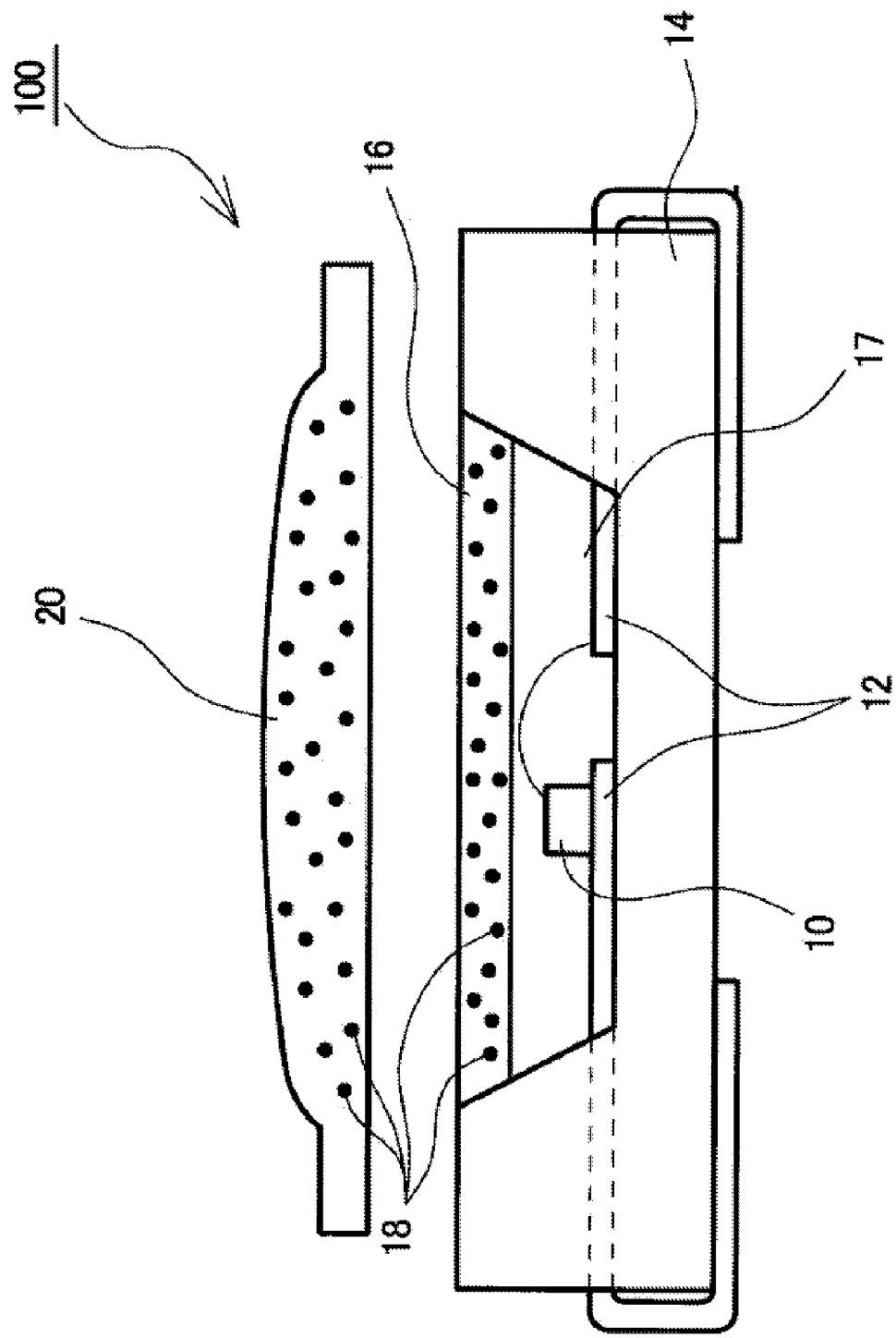
FIG. 3 is a cross-sectional view of an exemplary light-emitting device in which the composition containing a quantum dot fluorescent body and the molded body of a quantum dot fluorescent body dispersion resin according to the first aspect of Embodiment are used.

In FIG. 3, a cross-sectional view of an exemplary light-emitting device using the composition containing a quantum dot fluorescent body and the molded body of a quantum dot fluorescent body dispersion resin according to the first aspect of Embodiment is illustrated, in which the same element as FIG. 1 is given with the same number. FIG. 3 is an example illustrating a light-emitting device in which the composition containing a quantum dot fluorescent body according to the first aspect of Embodiment is used in a part of the sealing material, and the resin lens 20 formed of the molded body of a quantum dot fluorescent body dispersion resin is disposed on the upperside of it. Also in this case, for each resin, the quantum dot fluorescent body 18 is dispersed in concentration range of 0.01% by mass to 20% by mass in the cycloolefin (co)polymer.

The light-emitting device illustrated in FIGS. 1, 2, and 3 can also suppress the quenching of the quantum dot fluorescent body and can maintain stable performance as a light-emitting device. Thus, an electronic apparatus equipped with the light-emitting device, for example, a cellular phone, a display, and a panel, or a mechanical device equipped with the electronic apparatus, for example, an automobile, a computer, and a game machines, can be operated stably for a long period of time.

Second Aspect of Embodiment

Figure 4:
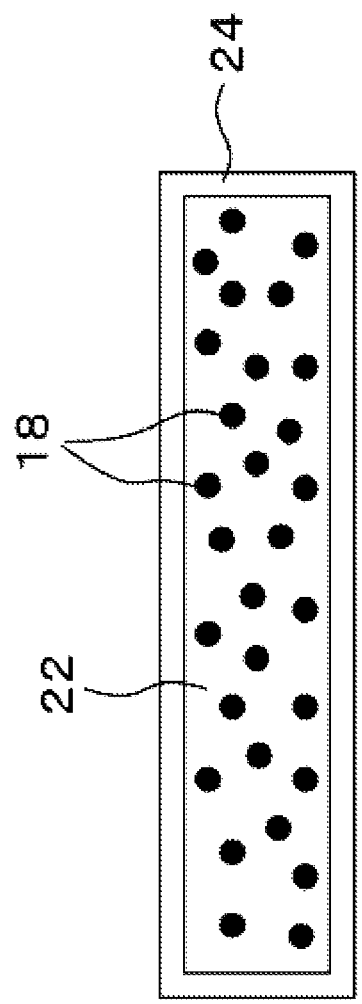
FIG. 4 is a cross-sectional view of an exemplary structure containing a quantum dot fluorescent body according to the second aspect of Embodiment.

In FIG. 4, a cross-sectional view of an exemplary structure containing the quantum dot fluorescent body according to the second aspect of Embodiment is illustrated. In FIG. 4, the structure containing the quantum dot fluorescent body is configured by including the molded body of a quantum dot fluorescent body dispersion resin 22 in which the quantum dot fluorescent body 18 is dispersed in concentration range of 0.01% by mass to 20% by mass in a resin for dispersion, and the gas barrier layer 24 which coats the entirety of the surface of the molded body of a quantum dot fluorescent body dispersion resin 22 to reduce the permeation of oxygen or the like to the molded body of a quantum dot fluorescent body dispersion resin 22. According to another embodiment, it may have a configuration in which the gas barrier layer 24 is coated on a part of the surface of the molded body of a quantum dot fluorescent body dispersion resin 22 (see, FIG. 6 and FIG. 7). Further, the gas barrier layer 24 preferably can reduce the permeation of water vapor in addition to oxygen. Herein, the gas barrier layer 24 means a layer, which is located near the structure containing the quantum dot fluorescent body and can protect the quantum dot fluorescent body 18 against oxygen or the like to the extent that, when a light-emitting diode (LED) is allowed to emit light continuously for 2000 hours, the spectral radiant energy from the quantum dot fluorescent body 18 can be maintained at least 70% of the initial value. Further, the spectral radiant energy indicates radiant energy at fluorescent wavelength of the quantum dot fluorescent body.

As the resin for dispersion constituting the molded body of a quantum dot fluorescent body dispersion resin 22, for example, the cycloolefin (co)polymer explained above in relation to the first aspect of Embodiment may be used. Further, as for the method of producing the molded body of a quantum dot fluorescent body dispersion resin 22, the method for producing the molded body of a quantum dot fluorescent body dispersion resin explained above in relation to the first aspect of Embodiment can be also used.

Further, the gas barrier layer 24 is configured by a layer of an ethylene.vinyl alcohol copolymer resin or polyvinylidene chloride, for example. It is also possible that it is configured with a layer formed by forming a silica film or an alumina film on at least one surface of a layer of the ethylene.vinyl alcohol copolymer resin or polyvinylidene chloride. Because all of those materials have a high gas barrier property, by constituting the gas barrier layer 24 using them, the quantum dot fluorescent body 18 can be protected against oxygen or the like.

Further, each resin constituting the molded body of a quantum dot fluorescent body dispersion resin 22 and the gas barrier layer 24 has a light transmitting property so that the light generated from a light-emitting diode is transmitted to the quantum dot fluorescent body 18 and the light having wavelength modified by the quantum dot fluorescent body 18 is transmitted to the outside of the molded body of a quantum dot fluorescent body dispersion resin 22.

The ethylene.vinyl alcohol copolymer resin used for the gas barrier 24 is represented by the following structural formula.

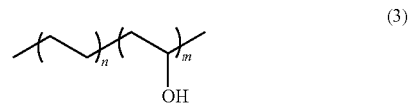

(3)

The ethylene.vinyl alcohol copolymer resin can be produced by a known method. It can be also obtained by, for example, copolymerizing ethylene and vinyl ester like vinyl acetate as a raw material in an alcohol solvent or the like using an azonitrile initiator or an organic peroxide initiator to produce an ethylene.vinyl ester copolymer, and adding an alkali catalyst for saponification of the vinyl ester component in the copolymer. Further, in the above formula, m and n are real numbers which are greater than 0 but smaller than 1 and they indicate copolymerization ratio of each repeating unit in the polymer (m is for vinyl alcohol and n is for ethylene). Herein, m+n=1 is satisfied. In addition, the ethylene copolymerization ratio in the ethylene.vinyl alcohol copolymer resin is preferably 20 to 35 mol % from the viewpoint of ensuring the gas barrier property required in the present example.

In addition, the polyvinylidene chloride used for the gas barrier layer 24 is represented by the following structural formula. Those obtained by copolymerization with a small amount of vinyl chloride or the like can be also used.

(4)

The polyvinylidene chloride can be produced by a known method. For example, it can be produced by obtaining a monomer according to de-hydrochlorination of 1,2-dichloroethane using calcium hydroxide or sodium hydroxide followed by purification, and polymerizing the monomer with an addition of an emulsifying agent. In addition, q in the above formula indicates a positive integer, which represents the repeat number of the monomer unit.

Figure 5:
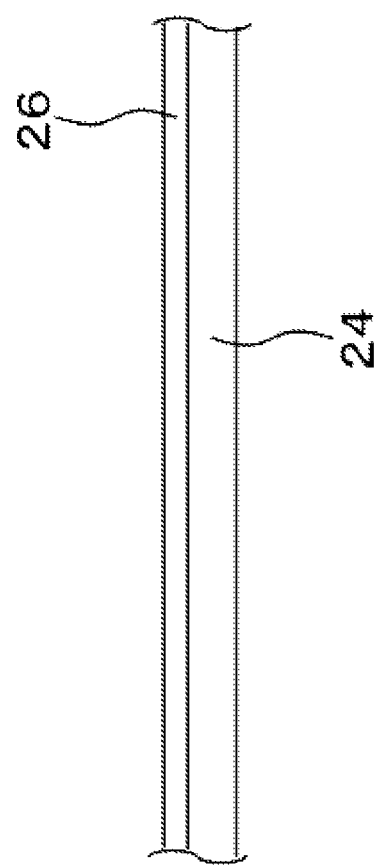
FIG. 5 is a partial cross-sectional view of the gas barrier layer according to the second aspect of Embodiment.

With each resin explained above, the gas barrier layer 24 according to the second aspect of Embodiment can be formed. In addition, as illustrated in FIG. 5 explained below, a silica film or an alumina film may be formed by vapor deposition on at least one surface of the gas barrier layer 24. This is because the transmission ratio of oxygen or the like can be further lowered by forming the silica film or the alumina film.

Further, as for the quantum dot fluorescent body used for the second aspect of Embodiment, those used for the first aspect of Embodiment can be also used.

In FIG. 5, a partial cross-sectional view of one example of the gas barrier layer 24 is illustrated. In FIG. 5, the auxiliary film 26 is formed on the gas barrier layer 24 by vapor deposition of silica or alumina. As for the vapor deposition method, a conventionally known method like atomic layer deposition can be used. Further, in FIG. 5, although the auxiliary film 26 is formed on only one surface of the gas barrier layer 24 (that is, upper surface in the drawing), the auxiliary film 26 can be formed on both surfaces (that is, upper and lower surfaces in the drawing).

Thickness of the gas barrier layer 24 explained above is preferably in the range of 0.5 nm to 20 µm. If it is thinner than 0.5 nm, the gas barrier property cannot be obtained at sufficient level. On the other hand, if it is thicker than 20 µm, the efficiency of extracting the light emitted from an LED is lowered.

In addition, the thickness of the auxiliary film 26 is preferably in the range of 10 nm to 20 nm. If it is thinner than 10 nm, the mechanical strength cannot be obtained at sufficient level. On the other hand, if it is thicker than 20 nm, the influence of the refractive index is significant so that the efficiency of extracting the light is lowered.

Figure 6:
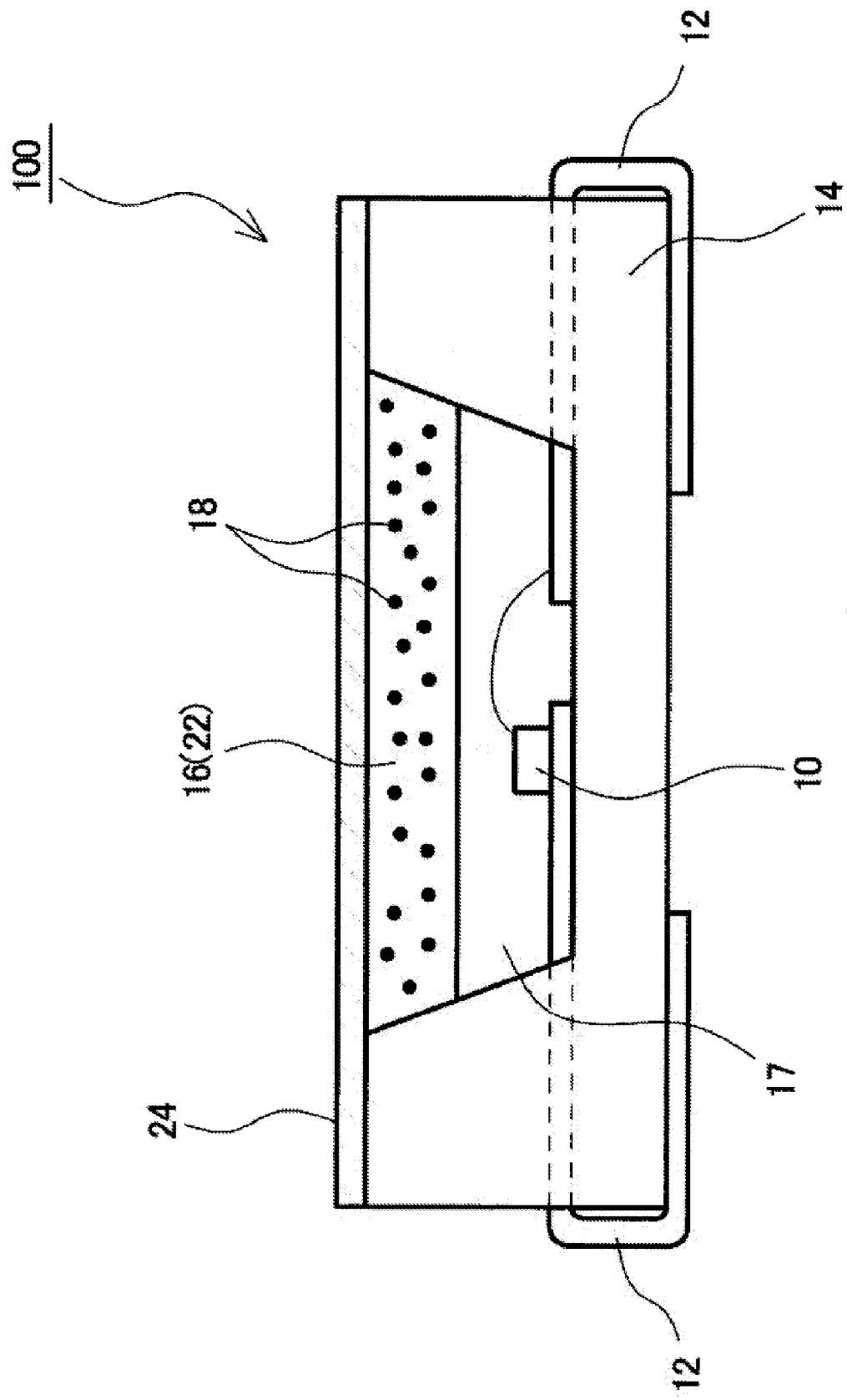
FIG. 6 is a cross-sectional view of an exemplary light-emitting device in which the structure having the quantum dot fluorescent body according to the second aspect of Embodiment is applied.

FIG. 6 illustrates a cross-sectional view of an exemplary light-emitting device in which the structure having the quantum dot fluorescent body according to the second aspect of Embodiment is applied. In FIG. 6, the light-emitting device 100 is configured by including the LED chip 10, the lead electrode 12, the cup 14, the sealing material 16 in which the quantum dot fluorescent body 18 is dispersed, the sealing material 17 in which the quantum dot fluorescent body 18 is not dispersed, and the gas barrier layer 24. In the example of FIG. 6, the gas barrier layer 24 is used as a cover of the cup 14. In addition, the sealing material 16 is configured with the molded body of a quantum dot fluorescent body dispersion resin 22 which is molded with the composition containing a quantum dot fluorescent body explained in the first aspect of Embodiment. The sealing material 16 and the sealing material 17 can be produced in the same manner as FIG. 1. Among the constitutional elements described above, the quantum dot fluorescent body 18, the molded body of a quantum dot fluorescent body dispersion resin 22, and the gas barrier layer 24 are the same as those described above.

Although not specifically limited, a light-emitting diode which constitutes a light source of a suitable wavelength in cooperation with the quantum dot fluorescent body can be used as the LED chip 10. The cup 14 may be formed of a suitable resin or ceramics. Further, the sealing material 17 is formed of an epoxy resin, silicone resin, or the like to seal the LED chip 10, the lead electrode 12, or the like.

According to the configuration illustrated in FIG. 6, the cover of the cup 14 is formed of the gas barrier layer 24 to coat the upper surface of the sealing material 16 in the drawing. As a result, permeation of oxygen or the like into the quantum dot fluorescent body 18 that is dispersed in the sealing material 16 can be either avoided or reduced.

In addition, since the gas barrier layer 24 is configured by the light transmitting resin described above, the light from the LED chip 10 is converted to white light or the like by the quantum dot fluorescent body 18 that is dispersed in the sealing material 16, and then extracted through the gas barrier layer 24 to the outside.

Figure 7:
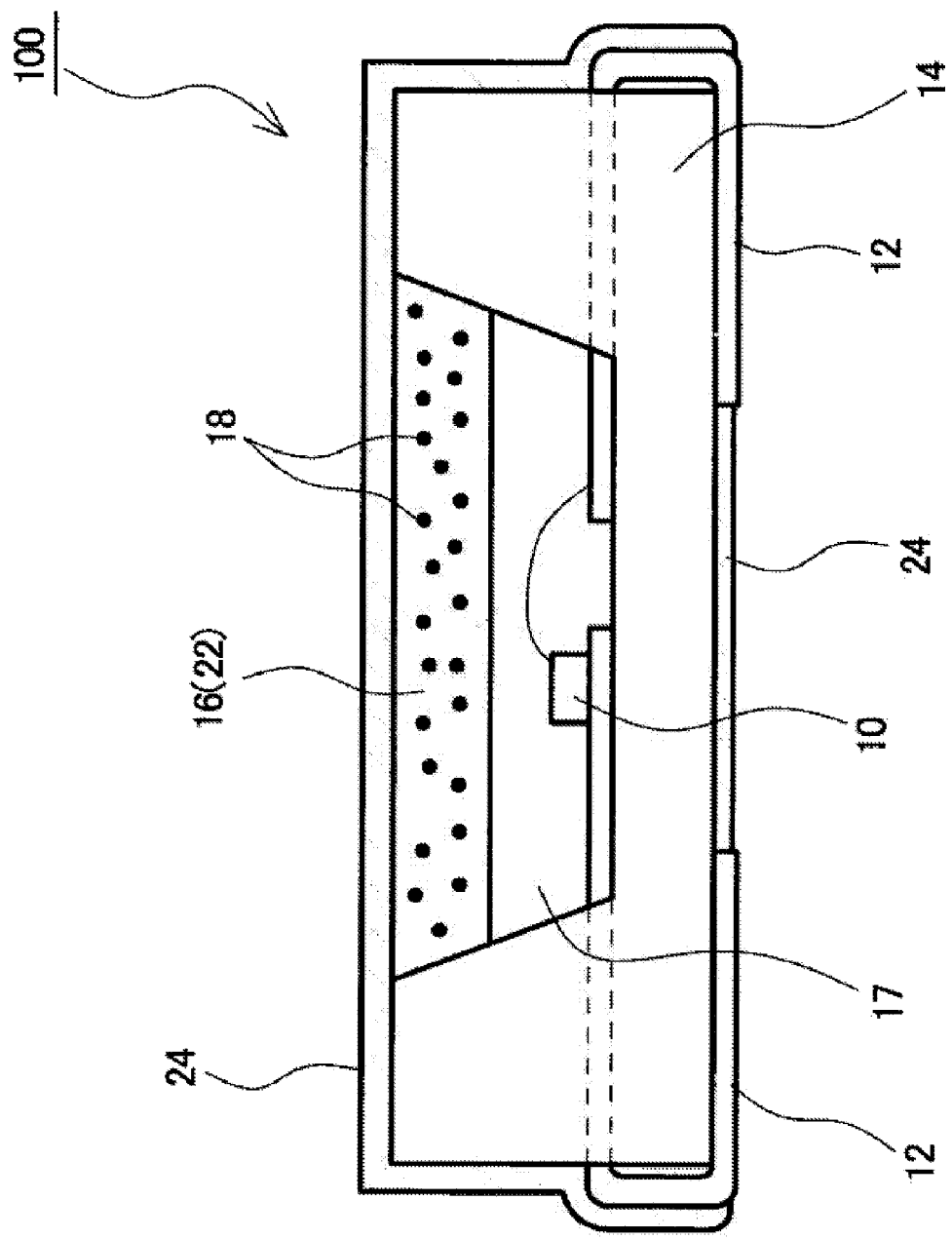
FIG. 7 is a cross-sectional view of another exemplary light-emitting device in which the structure having the quantum dot fluorescent body according to the second aspect of Embodiment is applied.

FIG. 7 illustrates a cross-sectional view of another exemplary light-emitting device in which the structure having the quantum dot fluorescent body according to the second aspect of Embodiment is applied, in which the same element as FIG. 6 is given with the same number. In the example of FIG. 7, the surface of the cup 14 (including the cover part of FIG. 6) and the surface of the lead electrode 12 which is exposed to the outside of the cup 14 are coated with the gas barrier layer 24. Further, a part of the surface of the lead electrode 12 is exposed without being coated with the gas barrier layer 24. The reason therefor is to be electrically conductive with power supply paths on a mounted substrate, for example.

Also in the present example, the gas barrier layer 24 is coated on the upper surface of the sealing material 16 in the drawing. As a result, permeation of oxygen or the like into the quantum dot fluorescent body 18 that is dispersed in the sealing material 16 can be either avoided or reduced.

In addition, a part of the light from the LED chip 10 is converted to light with a different wavelength by the quantum dot fluorescent body 18 dispersed in the sealing material 16, mixed with the light from the LED chip 10, transmitted through the gas barrier layer 24, and then extracted to the outside.

The structure containing the quantum dot fluorescent body which is explained by FIG. 4 can be applied to a lighting device for plant cultivation, a color lighting device, a white lighting device, a light source for LED backlight, a liquid crystal filter added with fluorescent body, a resin plate containing fluorescent body, a light source for hair growing device, and a light source used for communication, or the like.

Further, since the light-emitting device illustrated in FIG. 6 and FIG. 7 can have extended lifetime of quantum dot and thus can maintain stable performance for a long period of time, an electronic apparatus equipped with the light-emitting device like a cellular phone, a display, and a panel, or a mechanical device equipped with the electronic apparatus, for example, an automobile, a computer, and a game machines, can be operated stably for a long period of time.

EXAMPLES

Specific examples of the invention will be described hereinafter in view of Examples. However, it is evident that the invention is not limited to the following Examples.

In Examples, the quantum efficiency and spectral radiant energy were measured by using a quantum efficiency measurement system QE-1000 manufactured by OTSUKA ELECTRONICS CO., LTD. Further, the spectral radiant energy corresponds to the radiant energy at the fluorescent wavelength of the quantum dot fluorescent body which is used in the present examples.

Example 1

Under argon gas atmosphere, 5 g of COP type cycloolefin polymer (ZEONEX480R manufactured by Zeon Corporation, Japan; non-crystalline resin including the structural Formula (2)) and 5 g of anhydrous toluene (manufactured by Wako Pure Chemical Industries, Ltd.), which were vacuum-freeze deaerated and thereafter, kept under argon gas atmosphere, were added to a 50 mL glass screw bottle and dissolved at room temperature by stirring on a roller type stirrer to obtain the resin solution ZT50-1.

To the obtained resin solution ZT50-1, 3.05 g of toluene dispersion liquid prepared to have the quantum dot fluorescent body at 82 mg/ml was added under argon gas atmosphere. The quantum dot fluorescent body is nanoparticles which have a core and shell structure as a molecular structure in which InP is a core and ZnS is a shell and myristic acid is used as a capping agent. Those with core diameter of 2.1 nm were used. Thereafter, by using a planetary centrifugal mixing device ARV310-LED manufactured by THINKY CORPORATION, they were fully mixed to obtain the dispersion liquid (that is, composition containing a quantum dot fluorescent body) Q5ZT50-1 containing the quantum dot fluorescent body in an amount of 5% by mass with respect to the cycloolefin polymer. The dispersion liquid was poured within a silicone ring (outer diameter 55 mm×inner diameter 50 mm×thickness 1 mm) placed on a polymethylpentene petri dish. It was air dried by itself under argon gas atmosphere to obtain a plate-like molded body, which was then dried for 5 hours at the temperature of 40° C. in Inert Ovens flushed with nitrogen gas to remove completely the solvent. As a result, the molded body of a quantum dot fluorescent body dispersion resin ZSQ-1 was obtained.

Subsequently, for protection of the quantum dot fluorescent body against air, on the surface of the molded body of a quantum dot fluorescent body dispersion resin ZSQ-1, an ethyl acetate solution containing Saran resin F310 (manufactured by Asahi Kasei Corp., main component is polyvinylidene chloride) in an amount of 5% by mass was coated and dried to form a gas barrier layer. As a result, the structure AZSQ-1 having the quantum dot fluorescent body was obtained. Thickness of the gas barrier layer was 17 μm. The quantum efficiency of AZSQ-1 was measured by using a quantum efficiency measurement system QE-1000 manufactured by OTSUKA ELECTRONICS CO., LTD, and it was found to be 74%. This value is comparable to the quantum efficiency of 80% which is obtained for a case in which the same measurement is carried out for the toluene dispersion liquid containing the quantum dot fluorescent body as a standard. The results are given in Table 1.

Further, AZSQ-1 was disposed on a 22 mW and 450 nm blue LED package and then allowed to emit light continuously for 2000 hours under atmospheric air condition. The spectral radiant energy of the quantum dot fluorescent body was 0.42 (mW/nm) at the initial stage of light emission by the LED. Meanwhile, the spectral radiant energy after 2000 hours was 0.38 (mW/nm). Thus, it was found that the spectral radiant energy after 2000 hours maintains the value that is as high as 90% of the initial value. The results are given in Table 1.

Example 2

The molded body of a quantum dot fluorescent body dispersion resin ZSQ-1 obtained from Example 1 was processed with pressures of 20 MPa using a pressing machine heated to 180° C. As a result, the resin film FZSQ-1 containing the quantum dot fluorescent body with thickness of 100 μm was obtained.

Subsequently, for protection of the quantum dot fluorescent body against air, on the surface of the film FZSQ-1 containing the quantum dot fluorescent body, an ethyl acetate solution containing Saran resin F310 (manufactured by Asahi Kasei Corp.) in an amount of 5% by mass was coated and dried to form a gas barrier layer. As a result, the structure AFZSQ-1 having the quantum dot fluorescent body with the gas barrier layer was obtained. Thickness of the gas barrier layer was 10 μm.

With the structure AFZSQ-1, the same measurement as Example 1 was performed. As a result, the quantum efficiency was found to be 76%, indicating a good value. The results are given in Table 1. Further, the spectral radiant energy of the structure AFZSQ-1 at the initial stage of light emission, which was measured in the same manner as Example 1, was 0.39 (mW/nm) while the spectral radiant energy after 2000 hours was 0.35 (mW/nm). Thus, it was found that the spectral radiant energy after 2000 hours maintains the value that is as high as 90% of the initial value. The results are given in Table 1.

Example 3

Under argon gas atmosphere, Q5ZT50-1 obtained from Example 1 was injected in an amount of 2.0 μL using a pipettor to a cup mounted with a 22 mW and 450 nm blue LED. After being air dried for 2 hours, it was maintained for 5 hours on a hot plate kept at 40° C. to manufacture an LED package. Then, a gas barrier layer was formed in the same manner as Example 2 on the surface of the sealing material. Thickness of the gas barrier layer was 20 μm.

The light emission was allowed to occur continuously for 2000 hours under atmospheric air condition by applying 20 mA current to the LED package. The spectral radiant energy of the quantum dot fluorescent body at the initial stage of light emission by LED was 0.41 (mW/nm) while the spectral radiant energy after 2000 hours was 0.34 (mW/nm). Thus, it was found that the spectral radiant energy after 2000 hours maintains the value that is as high as 83% of the initial value. The results are given in Table 1.

Example 4

The molded body of a quantum dot fluorescent body dispersion resin ZSQ-2 was obtained in the same manner as Example 1, except that ZEONEX480R described in Example 1 is changed to APEL resin (lot number: L5014DP, resin having the structural Formula (1)) manufactured by Mitsui Chemicals, Inc.).

Subsequently, for protection of the quantum dot fluorescent body against air, on the surface of the molded body of a quantum dot fluorescent body dispersion resin ZSQ-2, a gas barrier layer was formed in the same manner as Example 1, and the structure AZSQ-2 having the quantum dot fluorescent body was obtained. The quantum efficiency of AZSQ-2 was measured by a known method, and it was found to be 75%. The structure AZSQ-2 having the quantum dot fluorescent body was disposed on a 22 mW and 450 nm blue LED package and allowed to emit light continuously for 2000 hours under atmospheric air condition. The spectral radiant energy of the quantum dot fluorescent body was 0.43 (mW/nm) at the initial stage of light emission by the LED. Meanwhile, the spectral radiant energy after 2000 hours was 0.39 (mW/nm). Thus, it was found that the spectral radiant energy after 2000 hours maintains the value that is as high as 90% of the initial value. The results are given in Table 1.

Example 5

The molded body of a quantum dot fluorescent body dispersion resin ZSQ-3 was obtained in the same manner as Example 1, except that concentration (% by mass) of the quantum dot contained in the COP as described in Example 1 is changed to 20% by mass.

Subsequently, on the surface of the molded body of a quantum dot fluorescent body dispersion resin ZSQ-3, a gas barrier layer was formed in the same manner as Example 4, and the structure AZSQ-3 having the quantum dot fluorescent body was obtained. The quantum efficiency of AZSQ-3 was measured by a known method, and it was found to be 74%. The structure AZSQ-3 having the quantum dot fluorescent body was disposed on a 22 mW and 450 nm blue LED package and allowed to emit light continuously for 2000 hours under atmospheric air condition. The spectral radiant energy of the quantum dot fluorescent body was 0.70 (mW/nm) at the initial stage of light emission by the LED. Meanwhile, the spectral radiant energy after 2000 hours was 0.63 (mW/nm). Thus, it was found that the spectral radiant energy after 2000 hours maintains the value that is as high as 90% of the initial value. The results are given in Table 1.

Example 6

The molded body of a quantum dot fluorescent body dispersion resin ZSQ-4 was obtained in the same manner as Example 1, except that concentration (% by mass) of the quantum dot contained in the COP as described in Example 1 is changed to 0.01% by mass.

Subsequently, on the surface of the molded body of a quantum dot fluorescent body dispersion resin ZSQ-4, a gas barrier layer was formed in the same manner as Example 4, and the structure AZSQ-4 having the quantum dot fluorescent body was obtained. The quantum efficiency of AZSQ-4 was measured by a known method, and it was found to be 75%. The structure AZSQ-4 having the quantum dot fluorescent body was disposed on a 22 mW and 450 nm blue LED package and allowed to emit light continuously for 2000 hours under atmospheric air condition. The spectral radiant energy of the quantum dot fluorescent body was 0.13 (mW/nm) at the initial stage of light emission by the LED. Meanwhile, the spectral radiant energy after 2000 hours was 0.12 (mW/nm). Thus, it was found that the spectral radiant energy after 2000 hours maintains the value that is as high as 90% of the initial value. The results are given in Table 1.

Examples 7 to 9

Except that the gas barrier is formed with EVAL M100B (ethylene.vinyl alcohol copolymer resin manufactured by KURARAY CO., LTD., ethylene copolymerization ratio of 24 mol %), the same processes as Examples 1 to 3 were performed. Thickness of the gas barrier layer was 20 µm.

The quantum efficiency was measured for Example 7 and Example 8. As a result, it was 75% for Example 7 and 72% for Example 8, indicating good results. The results are given in Table 1. For Example 8, the formed AFZSQ-5 was disposed on a 22 mW and 450 nm blue LED package and then allowed to emit light continuously for 2000 hours under atmospheric air condition. For Example 9, the light emission was allowed to occur continuously for 2000 hours under atmospheric air condition by applying 20 mA current to the LED package. The spectral radiant energy of the quantum dot fluorescent body at the initial stage of light emission by the LED was 0.43 (mW/nm) and 0.46 (mW/nm) for Example 8 and Example 9, respectively. Meanwhile, the spectral radiant energy after 2000 hours was 0.37 (mW/nm) and 0.36 (mW/nm) for Example 8 and Example 9, respectively. Thus, it was found that the spectral radiant energy after 2000 hours maintains the value that is as high as 86% and 78% of the initial value for Example 8 and Example 9, respectively. The results are given in Table

Examples 10 to 12

According to an atomic layer deposition method, 20 nm silica layer was formed on the surface of the gas barrier layer which was formed on each of AZSQ-1, AFZSQ-1, and LED package, obtained from Examples 1 to 3, and then the same measurement was carried out.

The quantum efficiency was measured for Example 10 and Example 11. As a result, it was 73% for Example 10 and 76% for Example 11, indicating good results. The results are given in Table 1. For Example 11, the blue LED was allowed to emit light continuously for 2000 hours under atmospheric air condition. For Example 12, the light emission was allowed to occur continuously for 2000 hours under atmospheric air condition by applying 20 mA current to the LED package. The spectral radiant energy of the quantum dot fluorescent body at the initial stage of light emission by the LED was 0.39 (mW/nm) and 0.46 (mW/nm) for Example 11 and Example 12, respectively. Meanwhile, the spectral radiant energy after 2000 hours was 0.36 (mW/nm) and 0.45 (mW/nm) for Example 11 and Example 12, respectively. Thus, it was found that the spectral radiant energy after 2000 hours maintains the value that is as high as 92% and 98% of the initial value for Example 11 and Example 12, respectively. The results are given in Table 1.

Examples 13 to 15

According to an atomic layer deposition method, 20 nm silica layer was formed in the same manner as Examples 10 to 12 on the surface of each of the gas barriers layers obtained from Examples 7 to 9, and then the same measurement was carried out.

The quantum efficiency was measured for Example 13 and Example 14. As a result, it was 73% for Example 13 and 74% for Example 14, indicating good results. The results are given in Table 1. For Example 14, the blue LED was allowed to emit light continuously for 2000 hours under atmospheric air condition. For Example 15, the light emission was allowed to occur continuously for 2000 hours under atmospheric air condition by applying 20 mA current to the LED package. The spectral radiant energy of the quantum dot fluorescent body at the initial stage of light emission by the LED was 0.41 (mW/nm) and 0.44 (mW/nm) for Example 14 and Example 15, respectively. Meanwhile, the spectral radiant energy after 2000 hours was 0.37 (mW/nm) and 0.39 (mW/nm) for Example 14 and Example 15, respectively. Thus, it was found that the spectral radiant energy after 2000 hours maintains the value that is as high as 90% and 89% of the initial value for the Example 14 and the Example 15, respectively. The results are given in Table 1.

Comparative Example 1

3.05 g of toluene dispersion prepared to have the quantum dot fluorescent body at 82 mg/ml was collected in a 50 mL Schlenk flask under argon gas atmosphere. The quantum dot fluorescent body is nanoparticles which have a core and shell structure as a molecular structure in which InP is a core and ZnS is a shell. Those with core diameter of 2.1 nm were used. Toluene was removed by vacuum drying and, under argon gas atmosphere, SCR1011A 2.5 (g) and SCR1011B 2.5 (g) (both are a two-liquid type thermoset silicone resin, manufactured by Shin-Etsu Chemical Co., Ltd.) were added and mixed to give a SiQD resin solution containing the quantum dot fluorescent body in an amount of 5% by mass with respect to the thermoset silicone resin. Under argon gas atmosphere, the obtained SiQD resin solution was injected in an amount of 2.0 µL using a pipettor to a cup mounted with a 22 mW and 450 nm blue LED. After that, it was maintained for 1 hour on a hot plate kept at 70° C. and further heated for 5 hours with hot plate temperature of 120° C. to manufacture an LED package. Then, a gas barrier layer was formed in the same manner as Example 2 on the surface of the sealing material. Thickness of the gas barrier layer was 20 µm.

The light emission was allowed to occur continuously for 2000 hours under atmospheric air condition by applying 20 mA current to the LED package. The spectral radiant energy of the quantum dot fluorescent body at the initial stage of light emission by LED was 0.37 (mW/nm) while the spectral radiant energy after 2000 hours was 0.02 (mW/nm). Thus, it was found that the fluorescence intensity after 2000 hours was significantly lowered such that it is only 5% of the initial value. The results are given in Table 2.

Comparative Example 2

The molded body of a quantum dot fluorescent body dispersion resin was obtained in the same manner as Example 4, except that concentration (% by mass) of the quantum dot described in Example 4 is changed to 0.008% by mass.

Subsequently, on the surface of the molded body of a quantum dot fluorescent body dispersion resin, a gas barrier layer was formed in the same manner as Example 4, and the structure having the quantum dot fluorescent body was obtained. The quantum efficiency of the structure having the quantum dot fluorescent body was measured by a known method, and it was found to be 75%. The structure having the quantum dot fluorescent body was disposed on a 22 mW and 450 nm blue LED package and allowed to emit light continuously for 2000 hours under atmospheric air condition. The spectral radiant energy of the quantum dot fluorescent body was 0.09 (mW/nm) at the initial stage of light emission by the LED. Meanwhile, the spectral radiant energy after 2000 hours was the detection limit or lower. The results are given in Table 2.

Comparative Example 3

The molded body of a quantum dot fluorescent body dispersion resin was obtained in the same manner as Example 4, except that concentration (% by mass) of the quantum dot described in Example 4 is changed to 23% by mass.

Subsequently, on the surface of the molded body of a quantum dot fluorescent body dispersion resin, a gas barrier layer was formed in the same manner as Example 4, and the structure having the quantum dot fluorescent body was obtained. The quantum efficiency of structure having the quantum dot fluorescent body was measured by a known method, and it was found to be 74%. The structure having the quantum dot fluorescent body was disposed on a 22 mW and 450 nm blue LED package and allowed to emit light continuously for 2000 hours under atmospheric air condition. The spectral radiant energy of the quantum dot fluorescent body was 0.81 (mW/nm) at the initial stage of light emission by the LED. Meanwhile, the spectral radiant energy after 2000 hours was 0.40 (mW/nm). Thus, the spectral radiant energy after 2000 hours was only 49% of the initial energy, indicating a low value. Aggregation of the quantum dot fluorescent body was also observed. The results are given in Table 2.

Comparative Example 4

Except that a PET film layer is formed instead of a gas barrier layer on the surface of the sealing material, the LED package was manufactured in the same manner as Example 3. The PET film does not have a gas barrier property that is comparable to the gas barrier layer of the each example described above (that is, the gas barrier property is low).

Under atmospheric air condition, the LED package was applied with 20 mA current and allowed to emit light continuously for 2000 hours. The spectral radiant energy of the quantum dot fluorescent body was 0.23 (mW/nm) at the initial stage of light emission by the LED. Meanwhile, the spectral radiant energy after 2000 hours was 0.02 (mW/nm). Thus, the spectral radiant energy after 2000 hours was lowered to only 9% of the initial energy. The results are given in Table 2. Further, in Comparative Example 4, the spectral radiant energy of the quantum dot fluorescent body at the initial stage of light emission by the LED was also lower than that of each Example. This is because, as there is no layer present corresponding to the gas barrier layer of each Example (that is, the gas barrier property of PET film is insufficient), the quantum dot fluorescent body has been deteriorated in short time by oxygen or the like.

TABLE 1

| | Chemical structure of resin for dispersion | Concentration of quantum dot contained in resin for dispersion described in the left (% by mass) | Gas barrier layer | Quantum efficiency | Initial spectral radiant energy (mW/nm) | Spectral radiant energy after 2000 hour continuous lighting (mW/nm) (value within parentheses indicates ratio (%) with respect to initial value) |
|---|---|---|---|---|---|---|
| Toluene dispersion of quantum dot | | | | 80% | | |
| Example 1 | Formula (2) | 5 | Saran resin | 74% | 0.42 | 0.38 (90%) |
| Example 2 | Formula (2) | 5 | Saran resin | 76% | 0.39 | 0.35 (90%) |
| Example 3 | Formula (2) | 5 | Saran resin | — | 0.41 | 0.34 (83%) |
| Example 4 | Formula (1) | 5 | Saran resin | 75% | 0.43 | 0.39 (90%) |
| Example 5 | Formula (2) | 20 | Saran resin | 74% | 0.70 | 0.63 (90%) |
| Example 6 | Formula (2) | 0.01 | Saran resin | 75% | 0.13 | 0.12 (90%) |
| Example 7 | Formula (2) | 5 | EVAL | 75% | — | — |
| Example 8 | Formula (2) | 5 | EVAL | 72% | 0.43 | 0.37 (86%) |
| Example 9 | Formula (2) | 5 | EVAL | — | 0.46 | 0.36 (78%) |
| Example 10 | Formula (2) | 5 | Saran resin + silica layer | 73% | — | — |
| Example 11 | Formula (2) | 5 | Saran resin + silica layer | 76% | 0.39 | 0.36 (92%) |
| Example 12 | Formula (2) | 5 | Saran resin + silica layer | — | 0.46 | 0.45 (98%) |
| Example 13 | Formula (2) | 5 | EVAL + silica layer | 73% | — | — |
| Example 14 | Formula (2) | 5 | EVAL + silica layer | 74% | 0.41 | 0.37 (90%) |
| Example 15 | Formula (2) | 5 | EVAL + silica layer | — | 0.44 | 0.39 (89%) |

TABLE 2

| | Chemical structure of resin for dispersion | Concentration of quantum dot contained in resin for dispersion described in the left (% by mass) | Gas barrier layer | Quantum efficiency | Initial spectral radiant energy (mW/nm) | Spectral radiant energy after 2000 hour continuous lighting (mW/nm) (value within parentheses indicates ratio (%) with respect to initial value) |
|---|---|---|---|---|---|---|
| Comparative Example 1 | Two-liquid type thermoset silicone resin | 5 | Saran resin | — | 0.37 | 0.02 (5%) |
| Comparative Example 2 | Formula (2) | 0.008 | Saran resin | 75% | 0.09 | Detection limit or lower |
| Comparative Example 3 | Formula (2) | 23 | Saran resin | 74% | 0.81 | 0.40 (49%) (aggregation is generated) |
| Comparative Example 4 | Formula (2) | 5 | PET | — | 0.23 | 0.02 (9%) |

According to Examples 1 to 6, the spectral radiant energy of the quantum dot fluorescent body after continuous light emission for 2000 hours by the LED was at least 80% of the initial value, and it is higher than Comparative Examples 1 to 3. Based on these results, it was found that the quenching of the quantum dot fluorescent body can be suppressed by dispersing the quantum dot fluorescent body in concentration range of 0.01% by mass to 20% by mass in the cycloolefin (co)polymer as a thermoplastic resin.

Further, according to Examples 1 to 15, the spectral radiant energy after continuous light emission for 2000 hours was at least 70% of the initial value, and it is higher than Comparative Example 4. Based on these results, it was found that the lifetime of the quantum dot fluorescent body can be extended by forming a gas barrier layer and by dispersing the quantum dot fluorescent body in the cycloolefin (co)polymer as a thermoplastic resin.

REFERENCE SIGNS LIST

10 LED chip, 12 lead electrode, 14 cup, 16, 17 sealing material, 18 quantum dot fluorescent body, 20 resin lens, 22 molded body of a quantum dot fluorescent body dispersion resin, 24 gas barrier layer, 26 auxiliary film, 100 light-emitting device.

The invention claimed is:

1. A composition comprising a quantum dot fluorescent body which is dispersed in a concentration range of 0.01% by mass to 20% by mass in a cycloolefin (co)polymer.

2. The composition according to claim 1, wherein the cycloolefin (co)polymer is represented by Formula (1) or (2):

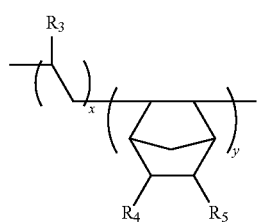

(1)

-continued

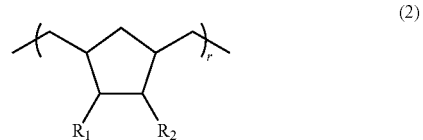

(2)

(here, $R_3$ in Formula (1) represents a monovalent group selected from the group consisting of a hydrogen atom, a linear or branched saturated hydrocarbon group (an alkyl group) having 1 to 6 carbon atoms, a halogen atom such as chlorine and fluorine, and a trihalomethyl group in which the halogen atom is either a chlorine atom or a fluorine atom; $R_4$ and $R_5$ in Formula (1) each independently represent a monovalent group selected from the group consisting of a hydrogen atom, a linear or branched saturated hydrocarbon group having 1 to 6 carbon atoms, a halogen atom such as chlorine and fluorine, and a trihalomethyl group in which the halogen atom is either a chlorine atom or a fluorine atom; the hydrocarbon group as $R_4$ and $R_5$ bind to each other at their neighboring substitution site to form at least one 5 to 7 membered cyclic structure of saturated hydrocarbon, and x and y are a real number which is greater than 0 but smaller than 1, and they are selected within the range satisfying x+y=1; and $R_1$ and $R_2$ in Formula (2) each independently represent a monovalent group selected from the group consisting of a hydrogen atom, a linear or branched saturated hydrocarbon group having 1 to 6 carbon atoms, a halogen atom such as chlorine and fluorine, and a trihalomethyl group in which the halogen atom is either a chlorine atom or a fluorine atom, and the hydrocarbon group as $R_1$ and $R_2$ bind to each other at their neighboring substitution site to form at least one 5 to 7 membered cyclic structure of saturated hydrocarbon, and r represents a positive integer).

3. A molded body of a quantum dot fluorescent body dispersion resin, being obtained as a molded body of the composition including the quantum dot fluorescent body according to claim 1.

4. The molded body of the quantum dot fluorescent body dispersion resin according to claim 3, wherein the molded body is a film, or a film or a lens having a projection on at least a portion of them.

5. A structure having a quantum dot fluorescent body, comprising: the molded body of the quantum dot fluorescent body dispersion resin according to claim 3; and
a gas barrier layer that reduces the permeation of oxygen to the molded body of the quantum dot dispersion resin, which is formed by coating a portion or the entirety of the surface of the molded body of the quantum dot fluorescent body dispersion resin.

6. The structure having a quantum dot fluorescent body according to claim 5, wherein the gas barrier layer is configured with an ethylene and vinyl alcohol copolymerization resin or a polyvinylidene chloride layer or it is configured with a layer, in which a silica film or an alumina film is formed on at least one surface of an ethylene and vinyl alcohol copolymerization resin or a polyvinylidene chloride layer.

7. A light-emitting device, in which the composition including the quantum dot fluorescent body according to claim 1 is used in at least part of a sealing material for an LED chip.

8. The light-emitting device according to claim 7, wherein the composition including a quantum dot fluorescent body is used in at least part of a sealing material for an LED chip and thickness of the sealing material is the same or greater than 0.01 mm but less than 0.4 mm.

9. The light-emitting device according to claim 7, wherein the molded body of a quantum dot fluorescent body dispersion resin according to claim 4 is further disposed on top of the sealing material.

10. The light-emitting device according to claim 7, wherein a gas barrier layer for reducing the permeation of oxygen to the sealing material is further disposed on top of the sealing material.

11. An electronic apparatus equipped with the light-emitting device according to claim 7.

12. A mechanical device equipped with the electronic apparatus according to claim 11.

13. A method for producing a molded body of a quantum dot fluorescent body dispersion resin comprising:
preparing a solution in which a cycloolefin (co)polymer is dissolved in a solvent;
preparing a composition containing a quantum dot fluorescent body by dispersing the quantum dot fluorescent body in the solution such that the concentration of the quantum dot fluorescent body in the molded body is in the range of 0.01% by mass to 20% by mass followed by kneading; and
heating and drying the composition containing a quantum dot fluorescent body after coating it on a substrate or filling it in a mold.

14. The composition according to claim 1, wherein an organic passivating layer is coordinated on a surface of a core of a quantum dot fluorescent body.

15. The composition according to claim 1, wherein the fluorescent body has a particle diameter of 1 nm to 100 nm.

* * * * *